United States Patent [19]

Okanobu

[11] Patent Number: 5,349,285
[45] Date of Patent: Sep. 20, 1994

[54] POWER SUPPLY CIRCUIT

[75] Inventor: Taiwa Okanobu, Tokyo, Japan

[73] Assignee: Sony Corporation, Tokyo, Japan

[21] Appl. No.: 51,787

[22] Filed: Apr. 26, 1993

[30] Foreign Application Priority Data

May 8, 1992 [JP] Japan .................................. 4-143208

[51] Int. Cl.$^5$ .............................................. G05F 3/26
[52] U.S. Cl. .................................... 323/312; 323/315; 323/316
[58] Field of Search ................ 323/312, 313, 314, 315, 323/316

[56] References Cited

U.S. PATENT DOCUMENTS

| | | |
|---|---|---|
| 4,503,478 | 3/1985 | Seki et al. ............................... 361/79 |
| 4,507,600 | 3/1985 | Okayama .............................. 323/281 |
| 4,825,142 | 4/1989 | Wang .................................... 323/314 |
| 4,950,976 | 8/1990 | Wagoner ............................... 323/312 |
| 5,030,903 | 7/1991 | Bernard et al. ....................... 323/313 |

Primary Examiner—Steven L. Stephan
Assistant Examiner—Adolf D. Berhane
Attorney, Agent, or Firm—Lewis H. Eslinger; Jay H. Maioli

[57] ABSTRACT

In a power supply circuit formed into an IC for use in a battery-powered apparatus, an operating current line of a first circuit and that of a second circuit are connected in series to a power source. An output line of a constant voltage regulator is connected to the middle junction of the series circuits so as to reduce the current consumption.

5 Claims, 6 Drawing Sheets

POWER SUPPLY CIRCUIT

BACKGROUND OF THE INVENTION

1. Field of the Invention

The present invention relates to a power supply circuit adapted for reducing a current consumption.

2. Description of the Related Art

In an integrated circuit (IC) designed for use in any apparatus such as a radio receiver where a battery is employed as a power source, it is requisite to sufficiently reduce a current consumption in the IC so as to prolong the service life of the battery.

In an attempt to meet the above requirement, there is contrived a circuit configuration of FIG. 6 which partially shows an intermediate frequency amplifier employed in an FM receiving circuit. In this diagram, a differential amplifier 1 is constituted of transistors Q1, Q2, a transistor Q0 as a constant current source, and resistors R1, R2; and another differential amplifier 2 is constituted of transistors Q3, Q4, resistors R1, R2 and resistors R3, R4.

An FM intermediate frequency signal is supplied from a preceding stage (not shown) to bases of the transistors Q1, Q2, and then the amplified outputs thereof are supplied from collectors of the transistors Q1, Q2 via capacitors C1, C2 to bases of the transistors Q3, Q4.

In this case, the signal current components included in the collector currents of the transistors Q1, Q2 are mutually opposite in phase, so that none of the signal current components from the transistors Q1, Q2 is delivered to the node of the resistors R1, R2 and the emitters of the transistors Q3, Q4. Therefore, as mentioned above, the transistors Q1, Q2 function as the differential amplifier 1 with the resistors R1, R2 serving as a load, while the transistors Q3, Q4 function as the differential amplifier 2 with the resistors R1, R2 as a constant current source.

Consequently, FM intermediate frequency signals amplified by the differential amplifiers 1, 2 are outputted from the collectors of the transistors Q3, Q4.

Thus, this circuit operates as a two-stage amplifier where the two differential amplifiers 1 and 2 are cascade-connected with respect to the alternating current, so that there is obtainable a two-stage gain. However, the current consumption is merely the value of one stage since, with respect to the direct current, the respective operating current lines of the differential amplifiers 1 and 2 are connected in series to the power source. According to this circuit, therefore, a two-stage gain can be realized with a one-stage current consumption to eventually achieve a reduction in the current consumption.

By applying the above idea to any device other than the differential amplifier, it becomes possible to operate two circuits with a one-circuit current consumption.

Low noise characteristic is a requisite in the first stage of a high frequency amplifier or the first stage of an FM intermediate frequency amplifier in an FM receiver. For the purpose of meeting such requirement, shot noise needs to be minimized by causing flow of a sufficiently great operating current of 100 $\mu$A or so in the first-stage transistor.

However, in the circuit of FIG. 6 where the operating currents of the transistors Q1, Q2 and those of the transistors Q3, Q4 are equal to each other, it follows that, when great operating currents are caused to flow in the first-stage transistors Q1, Q2, great currents flow also in the transistors Q3, Q4. As a result, there occurs a considerable voltage drop in, e.g., the resistors R3, R4 to eventually bring about a problem that the supply voltage VCC is not settable to a low value.

Furthermore, since the operating currents of the transistors Q1, Q2 are equal to those of the transistors Q3, Q4, it signifies that if the operating currents of, e.g., the transistors Q1, Q2 are changed in design, the operating points of the transistors Q3, Q4 are varied to eventually induce the necessity of changing the design with regard to the transistors Q3, Q4 as well.

Thus, it becomes necessary to set the operating currents in consideration of the operations of both the differential amplifiers 1 and 2. In an arrangement where the circuits are connected, instead of the differential amplifiers 1 and 2 in series to a power source, if the optimal operating currents are mutually different in the upper and lower circuits, one of such circuits fails to perform its best operation.

Further in the circuit configuration of FIG. 6, if there exists any imbalance between the transistors Q1 and Q2 or between the resistors R1 and R2 due to some variations in the manufacture of the IC, or between the signals supplied from the preceding stage to the transistors Q1 and Q2 respectively, then the signal current components included in the collector currents of the transistors Q1, Q2 are rendered mutually different.

And when any difference is existent between the signal current components included in the collector currents of the transistors Q1, Q2, a signal voltage component appears at the node of the resistors R1, R2 and the emitters of the transistors Q3, Q4. Therefore, in case the transistors Q1, Q2 are on the input side and the transistors Q3, Q4 are on the output side as shown in FIG. 6, the operation of the entire circuit may be rendered unstable. And the degree of freedom in designing the circuit is lowered if the configuration is modified to avert such operational instability.

OBJECT AND SUMMARY OF THE INVENTION

It is an object of the present invention to provide an improved power supply circuit which is capable of reducing a current consumption with solution of the problems observed in the related art mentioned.

According to one aspect of the present invention, there is provided a power supply circuit wherein an operating current line of a first circuit and that of a second circuit are connected in series to a power source, and an output line of a constant voltage regulator is connected to the middle junction of the series circuits.

In this circuit configuration, the first circuit comprises a transistor of a first polarity, while the second circuit comprises a transistor reverse in polarity to the transistor of the first circuit. And the difference between the operating currents of the first and second circuits is absorbed by the constant voltage regulator.

According to another aspect of the present invention, there is provided a power supply circuit wherein a first circuit, a second circuit and a constant voltage regulator are integrated to constitute an IC, and operating current lines of the first and second circuits are connected in series to each other between a power terminal and a ground terminal, and the output line of the constant voltage regulator is connected to the middle junction of the series circuits, so that the difference between the operating currents of the first and second circuits is absorbed by the constant voltage regulator.

Such power supply circuit is adapted for use as an IC in a radio receiver, wherein the first circuit serves as a high frequency amplifier, and the second circuit as a local oscillator.

In the power supply circuit employed as an IC in a radio receiver, the first circuit may be used as an intermediate frequency amplifier, and the second circuit as a high frequency amplifier and a local oscillator.

The above and other features and advantages of the present invention will become apparent from the following description which will be given with reference to the illustrative accompanying drawings.

DESCRIPTION OF TEE PREFERRED EMBODIMENTS

Figure 1:
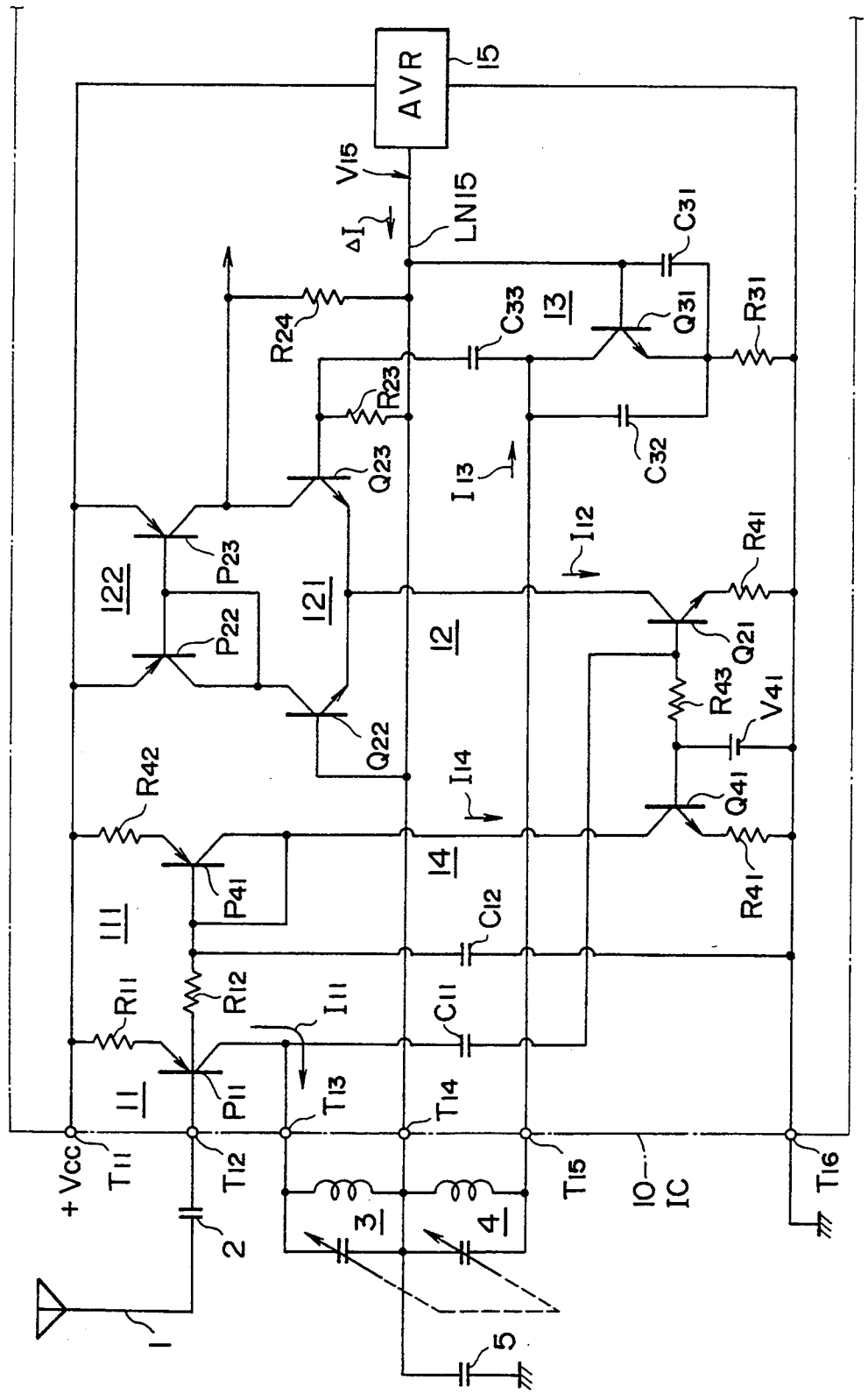
FIG. 1 is a connection diagram of an embodiment representing the power supply of the present invention.

FIG. 1 is a connection diagram in an exemplary case of applying the present invention to an FM front end circuit in a radio receiver, wherein a section 10 enclosed with a one-dot chained line is formed into an IC. Denoted by T11 to T16 are terminals (pins) for external connection, in which T11 is a power terminal, and T16 is a ground terminal. A supply voltage VCC from a power source to the terminal T11 is in a range of, e.g., 2 to 3 V.

For the IC 10, an antenna 1 is connected to the terminal T12 via a capacitor 2, and an antenna tuner 3 is connected between the terminals T13 and T14. Further a resonator 4 of a local oscillator is connected between the terminals T14 and T15, and the terminal T14 is grounded via a capacitor 5.

The IC 10 comprises a high frequency amplifier 11, a mixer 12, a local oscillator 13, a bias circuit 14, and a constant voltage regulator 15. An output line LN15 of the constant voltage regulator 15 is connected to the terminal T14.

The terminal T12 is connected to a base of a transistor P11 constituting the high frequency amplifier 11, and its emitter is connected via a resistor R11 to the terminal T11. A collector of the transistor P11 is connected to the terminal T13 while being connected also to a base of a transistor Q21 via a capacitor C11.

The transistor Q21 functions as a constant current source and constitutes a differential amplifier 121 in combination with other transistors Q22 and Q23. A bias voltage V41 is supplied via a buffer resistor R43 to a base of the transistor Q21, and its emitter is connected via a resistor R21 to the terminal T16, while its collector is connected to the emitters of the transistors Q22 and Q23. The base of the transistor Q22 is connected to the output line LN15, and the base of the transistor Q23 is connected via a buffer resistor R23 to the output line LN15.

There are further provided transistors P22 and P23, whose emitters are connected to the terminal T11, and whose bases are connected to each other while being connected also to the collector of the transistor P22, thereby forming a current mirror circuit 122 of which reference potential point is at the terminal T11. The collectors of the transistors P22, P23 are connected to the collectors of the transistors Q22, Q23 respectively, and a resistor R24 is connected between the collectors of the transistors Q23, P23 and the output line LN15. Thus, the mixer 12 is constituted of the differential amplifier 121 and the current mirror circuit 122.

A transistor Q31 is provided for local oscillation, and its base is connected to the output line LN15 while being connected also to its emitter via an oscillation capacitor C31. The emitter of the transistor Q31 is connected via a resistor R31 to the terminal T16, and an oscillation capacitor C32 is connected between its collector and emitter. Further the collector of the transistor Q31 is connected to the terminal T15 while being connected also to the base of the transistor Q23 via a capacitor C33. And thus the local oscillator 13 is constituted.

The bias circuit 14 comprises transistors P41 and Q41. A bias voltage V41 is supplied to the base of the transistor Q41, and its emitter is connected via a resistor R41 to the terminal T16, while its collector is connected to the collector of the transistor P41.

The transistor P41 constitutes, in combination with the transistor P11, a current mirror circuit 111 whose reference potential point is at the terminal T11. The emitter of the transistor P41 is connected via a resistor R42 to the terminal T11, and its collector and base are connected via a buffer resistor R12 to the base of the transistor P11 while being connected also to the terminal T16 via a capacitor C12.

In the constant voltage regulator 15 which will be described later with reference to FIG. 2, its DC potential V15 at the output line LN15 (i.e., the output voltage of the constant voltage regulator 15) is held at 1.1 V, and a direct current ΔI is delivered to or absorbed from the output line LN15.

In such circuit configuration, a direct current I14 of a predetermined value flows in the collector of the transistor Q41 due to the bias voltage V41, and such current I14 comes to flow in the collector of the transistor P41 as well. Since the transistors P41 and P11 constitute the current mirror circuit 111, a direct current I11 equivalent to the current I14 flows also in the collector of the transistor P11. Consequently the transistor P11 functions as a grounded-emitter circuit with respect to the alternating current, so that the radio-frequency input signal received at the antenna 1 is amplified by the transistor P11 and then is supplied to the tuner 3, whereby the broadcast signal of a desired frequency is obtained from the collector of the transistor P11.

The broadcast signal thus obtained is then supplied via the capacitor C11 to the base of the transistor Q21. In this stage of the operation, the bias voltage V41 is supplied to the transistor Q21, and the voltage V15 from the constant voltage regulator 15 is supplied as a bias voltage to the bases of the transistors Q22 and Q23, so that the collector currents of the transistors Q22, Q23 are changed in accordance with the broadcast signal supplied to the base of the transistor Q21.

Since the required DC voltage or current is supplied from the constant voltage regulator 15 to the transistor Q31, a local oscillation signal is obtained from the collector of the transistor Q31 and then is supplied via the capacitor C33 to the base of the transistor Q23. The base of the transistor Q22 is grounded via the capacitor 5 with respect to the alternating current.

Therefore, the collector currents of the transistors Q22, Q23 are changed in accordance with the broadcast signal supplied to the base of the transistor Q21 and also in accordance with the local oscillation signal supplied to the base of the transistor Q23. Thus, in the differential amplifier 121, the broadcast signal is multiplied by the local oscillation signal to thereby form an intermediate frequency signal.

In the differential amplifier 121 operating with the current mirror circuit 122 as a load, the intermediate frequency signal without any DC component (and any unrequited AC signal component) is obtained from the collectors of the transistors P23, Q23 and then is supplied to a next-stage intermediate frequency filter (not shown).

In this manner, the circuit of FIG. 1 functions as an FM front end circuit.

Now an exemplary embodiment of the constant voltage regulator 15 will be described below with reference to FIG. 2.

Figure 2:
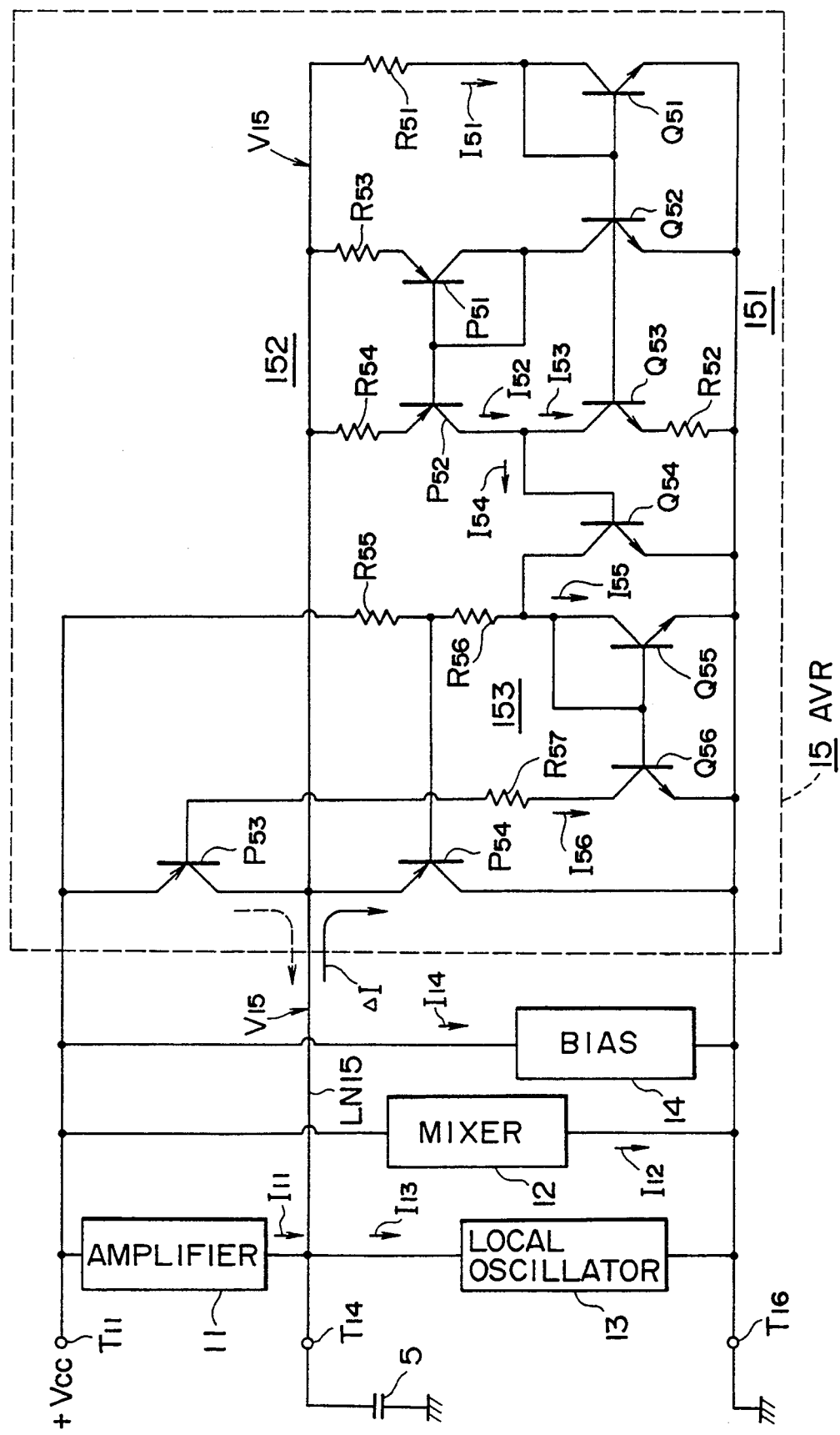
FIG. 2 is a detailed partial connection diagram of the embodiment shown in FIG. 1.

In FIG. 2, transistors Q51–Q53 constitute a current mirror circuit 151 where the transistor Q51 is on the input side while the transistors Q52, Q53 are on the output side, and a reference potential point is at the ground terminal T16. A resistor R51 is connected between the output line LN15 of the constant voltage regulator 15 and the collector of the transistor Q51, and a resistor R52 of a predetermined value is connected to the emitter of the transistor Q53. The base-emitter junction area of the transistor Q53 is set to be an n-fold multiple (where n>1) of that of the transistors Q51, Q52.

Transistors P51, P52 and emitter resistors R53, R54 constitute a current mirror circuit 152 where the transistor P51 is on the input side while the transistor P52 is on the output side, and a reference potential point is at the output line LN15. The collectors of the transistors P51, P52 are connected respectively to the collectors of the transistors Q52, Q53.

The collectors of the transistors P52, Q53 are connected to the base of a transistor Q54, whose emitter is connected to the terminal T16 and whose collector is connected to the collector of a transistor Q55.

The transistor Q55 constitutes, in combination with a transistor Q56, a current mirror circuit 153 where the transistor Q55 is on the input side while the transistor Q56 is on the output side, and a reference potential point is at the terminal T16. And resistors R55, R56 are connected in series between the terminal T11 and the collectors of the transistors Q54 and Q55.

The emitter-collector junction of the output transistor P53 is connected between the terminal T11 and the output line LN15, and the emitter-collector junction of the other output transistor P54 is connected between the output line LN15 and the terminal T16. Further the collector of the transistor Q56 is connected via a resistor R57 to the base of the transistor P53, and the middle junction of the resistors R55 and R56 is connected to the base of the transistor P54.

In such circuit configuration, the direct current I11 flowing in the transistor Q11 in FIG. 1 is fed from the terminal T11 to the terminal T14 via the transistor Q11 (and the terminal T13). Therefore, the high frequency amplifier 11 described in detail with reference to FIG. 1 can be considered, with respect to the direct current, in a state connected between the terminals T11 and T14 as shown in FIG. 2. Similarly, the other circuits 12 to 14 can also be considered as shown in the connection diagram of FIG. 2.

More specifically, the operating current line of the amplifier 11 and that of the local oscillator 13 are connected in series between the power terminal T11 and the ground terminal T16, and the middle junction of such series circuits is connected to the output line LN15, so that the direct currents I11 and I13 flowing respectively in the amplifier 11 and the local oscillator 13 are concerned with the operation of the constant voltage regulator 15.

The direct current I12 flowing in the mixer 12 is equivalent to the collector current of the transistor Q21.

When a power supply is switched on, the operating voltage VCC is applied to the terminal T11 and causes flow of the currents I11 and I13 in the circuits 11 and 13 respectively, so that the DC voltage V15 at the output line LN15 (and the terminal T14) is gradually raised.

The collector current I51 (DC) of the transistor Q51 is expressed as $$I51 = (VCC - V51)/R51 \qquad (1)$$

where V51 denotes the collector-emitter voltage of the transistor Q51. Thus, the current I51 is gradually increased.

The transistors Q51, Q52 constitute a current mirror circuit 151, and the transistors P51, P52 constitute a current mirror circuit 152, so that the collector current I52 (DC) of the transistor P52 is equal to I51, i.e., $$I52 = I51 \qquad (2)$$

The transistors Q51, Q53 also constitute the current mirror circuit 151, and the base-emitter junction area of the transistor Q53 is an n-fold multiple (where n>1) of that of the transistor Q51, so that the collector current I53 (DC) of the transistor Q53 is expressed as $$I53 = n \cdot I51 \qquad (3)$$

The base current I54 of the transistor Q54 is essentially given by $$I54 = I52 - I53 \qquad (4)$$

However, since I52<I53 from Eqs. (2) and (3) in this case, the base current I54 becomes zero (I54=0) and therefore the transistor Q54 is turned off.

In the off-state of the transistor Q54, a collector current I55 of a predetermined value flows in the transistor Q55 via the resistors R55 and R56. And since the transistors Q55, Q56 constitute a current mirror circuit 153, the collector current I56 (DC) of the transistor Q56 is equal to the current I55, i.e., I56=I55. The collector current I56 is supplied to the base of the transistor P53, which is thereby turned on.

If the resistance of the resistor R55 is selectively set to a proper value in advance, it becomes possible to raise the DC potential at the middle junction of the resistors R55 and R56 (toward the potential at the terminal T11)

despite the flow of the current I55 in the resistors R55 and R56, whereby the transistor P54 is turned off.

Thus, when the power supply is switched on, the transistor P53 is turned on while the transistor P54 is turned off, so that the voltage V15 at the output line LN15 is raised up to a predetermined threshold voltage VTH.

Upon arrival of the raised voltage V15 at the predetermined threshold voltage VTH, one of the transistors P53, P54 is turned on (active region) while the other is turned off, whereby the constant voltage regulator 15 is placed in its operation for voltage regulation.

More specifically, upon rise of the voltage V15 up to the predetermined threshold voltage VTH, the collector current I51 is increased according to Eq. (1), and then the collector current I52 is also increased according to Eq. (2) in conformity with the increase of the collector current I51.

Meanwhile the collector current I53 of the transistor Q53 is also supposed to increase according to Eq. (3) in conformity with the increase of the collector current I51. However, since the resistor R52 is connected to the emitter of the transistor Q53, the current I53 flows in the resistor R52 to cause a voltage drop, so that the increase of the current I53 is not so much as defined by Eq. (3).

Consequently, the collector currents are varied as I52>I53. And the base current I54 expressed by Eq. (4) below flows in the transistor Q54.

$$I54 = I52 - I53 \qquad (4)$$

As a result, the collector-emitter resistance of the transistor Q54 or the collector-emitter voltage thereof is changed.

The voltage V15 is raised under the condition of Ill>I13. And when the voltage V15 is raised beyond the threshold voltage VTH, the collector current I51 is increased to eventually cause increases of the currents I52 and I53. At this time, however, the current I52 is increased more than the current I53 due to the resistor R52, so that the base current I54 of the transistor Q54 is increased according to Eq. (4), and the collector-emitter resistance of the transistor Q54 is decreased.

Consequently the transistor Q55 is turned off, and then the transistors Q56 and P53 are also turned off. In this stage of the operation, the transistor P54 is biased via the resistor R56 and the collector-emitter junction of the transistor Q54 to be thereby turned on.

Therefore the difference current ΔI (=Ill−I13) denoted by a solid line flows from the amplifier 11 to the collector of the transistor P54, so that the voltage V15 is held at the predetermined threshold voltage VTH. More specifically, the current Ill flowing in the amplifier 11 is partially supplied as an operating current I13 to the local oscillator 13, while the remaining current ΔI of the current Ill flows into the constant voltage regulator 15.

In the case of Ill<I13, the voltage V15 is lowered. And upon its drop below the threshold voltage VTH, the current I51 is reduced to consequently cause reductions of the currents I52 and I53. At this time, however, the current I52 is reduced more than the current I53 due to the resistor R52, so that the base current I54 of the transistor Q54 is also reduced according to Eq. (4), whereby the collector-emitter resistance of the transistor Q54 is increased.

As a result, the transistor Q55 is turned on, and then the transistors Q56 and P53 are also turned on. In this stage of the operation, the collector-emitter resistance of the transistor Q54 is increased, so that the transistor P54 is turned off since its base bias voltage is rendered insufficient.

Therefore the difference current ΔI (denoted by a broken line) between the currents Ill and I13 flows from the collector of the transistor P53 to the local oscillator 13, so that the voltage V15 is held at the predetermined threshold value VTH. More specifically, the current Ill flowing in the amplifier 11 is partially supplied as the operating current I13 to the local oscillator 13, while the shortage current ΔI of the current I13 is supplied from the constant voltage regulator 15.

Thus, in the present invention where the operating current line of the amplifier 11 and that of the local oscillator 13 are connected in series to the power source, the two circuits 11 and 13 can be driven by the operating current required merely for a single circuit, so that the entire current consumption is reducible.

Furthermore, despite any difference between the operating current Ill of the amplifier 11 and the operating current I13 of the local oscillator 13, it is possible in the present invention to absorb such difference current ΔI by the constant voltage regulator 15, hence controlling the operating currents Ill and I13 of the amplifier 11 and the local oscillator 13 to the respective optimal values to consequently realize satisfactory operations of both the amplifier 11 and the local oscillator 13 in the best conditions.

Since the middle junction of the operating current lines of the amplifier 11 and the local oscillator 13 is bypassed by the capacitor 5 connected to the terminal T14, any signal current components, if included in the operating currents Ill and I13 flowing respectively in the amplifier 11 and the local oscillator 13, are kept free from harmfully affecting the circuits 13 and 11 on the opposite sides, so that the circuits are rendered capable of performing stable operations without any harmful influence. And the degree of freedom in designing the two circuits 11 and 13 can further be enhanced by the configuration mentioned.

In the amplifier 11 and the local oscillator 13 which are formed into a balanced type, if the balanced state thereof is upset due to some variations caused in the manufacture of the IC and any signal current components are included in the operating currents Ill and I13 of the circuits 11 and 13, no problem arises for the reason described above.

Furthermore, the local oscillator 13 is supplied with the regulated operating voltage V15 from the output line LN15 of the constant voltage regulator 15, so that a stable output signal can be obtained from the local oscillator 13.

Figure 3:
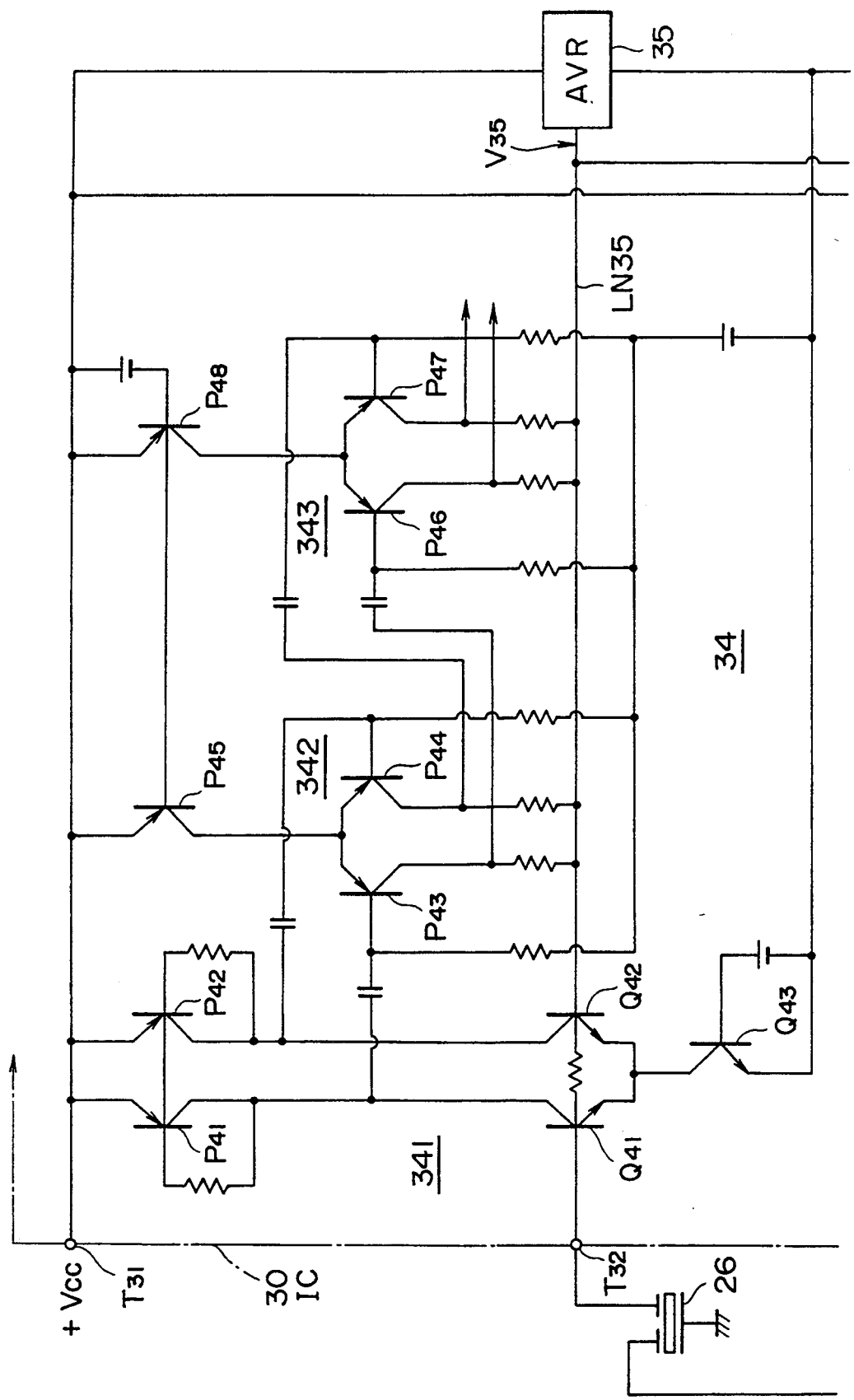
FIG. 3 is a partial connection diagram of another embodiment representing the circuit of the present invention.
Figure 4:
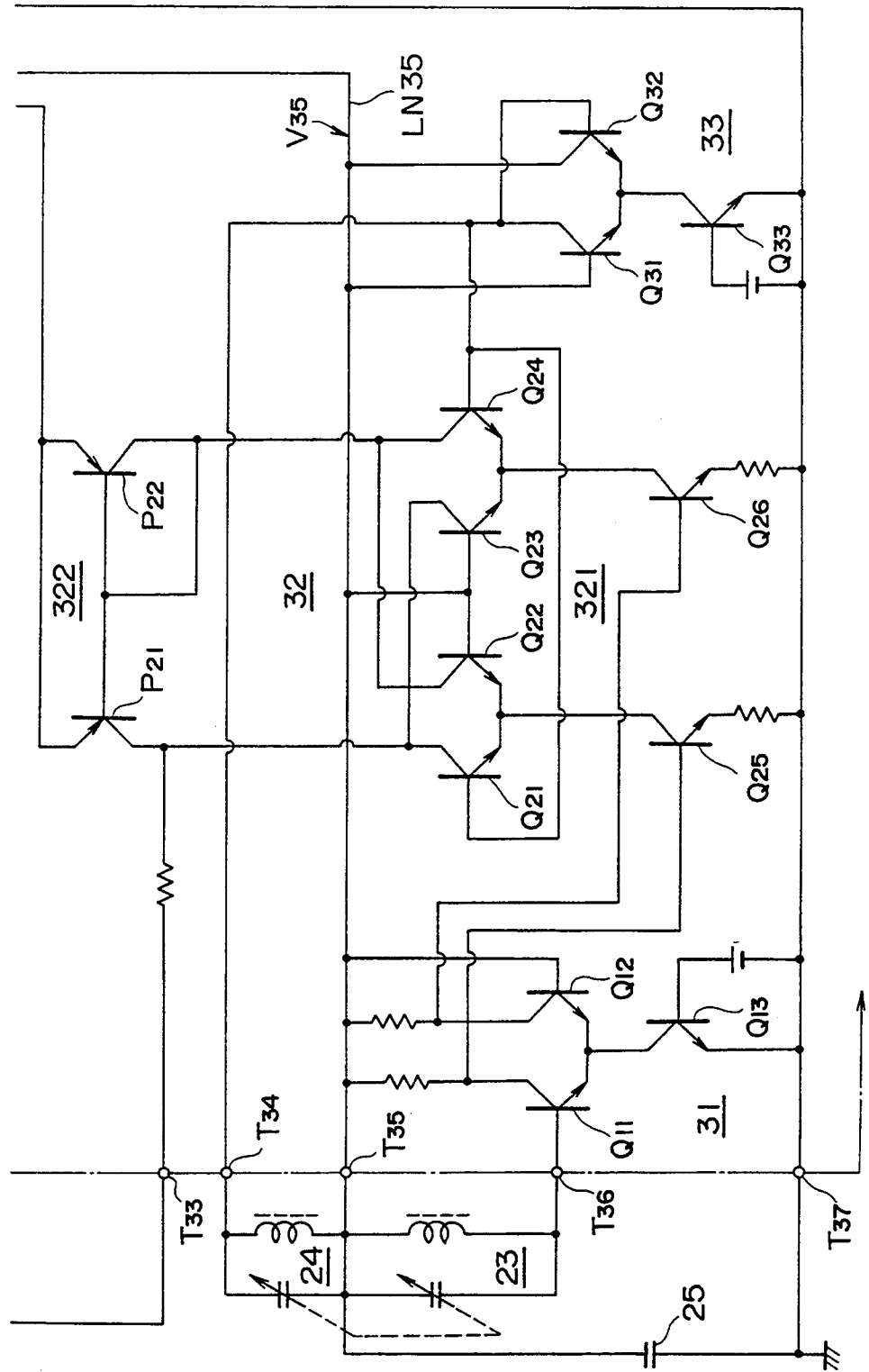
FIG. 4 is another partial connection diagram continuous with FIG. 3.

FIGS. 3 and 4 show an exemplary case of applying the present invention to an FM front end circuit and an intermediate frequency amplifier in a radio receiver, wherein the lower portion of FIG. 3 is continued on the upper portion of FIG. 4. And a section 30 enclosed with a chained line is formed into an IC. Denoted by T31 T37 are terminals for external connection, in which T31 is a power terminal, and T37 is a ground terminal. A supply voltage VCC from a power source to the terminal T31 is in a range of, e.g., 2 to 3 V.

For the IC 30, an antenna tuner 23 is connected between the terminals T35 and T36, and a resonator 24 of a local oscillator is connected between the terminals T34 and T35. The terminal T35 is grounded via a capacitor 25. And a ceramic filter 26 for AM intermediate frequency signal is connected between the terminals T33 and T32.

The IC 30 comprises a high frequency amplifier 31, a mixer 32, a local oscillator 33, an intermediate frequency amplifier 34, and a constant voltage regulator 35. This voltage regulator 35 is constituted similarly to the aforementioned constant voltage regulator 15 shown in FIG. 2, and its output line LN35 is connected to the terminal T35. An output voltage V35 of the constant voltage regulator 35 is set to, e.g., 1.1 V.

The high frequency amplifier 31 consists of a differential amplifier having transistors Q11–Q13, and its hot-side and ground-side power lines are connected to the output line LN35 and the terminal T37 respectively. The base of the transistor Q11 is connected to the terminal T36. A broadcast signal selected in the tuner 23 is amplified by the amplifier 31, and the unbalanced signal is converted to a balanced signal.

The mixer 32 comprises a double balanced multiplier 321 having transistors Q21–Q26, and a current mirror circuit 322 having transistors P21 and P22. Its hot-side and ground-side power lines are connected to the terminals T31 and T37 respectively. And a balanced broadcast signal obtained from the amplifier 31 is supplied to the bases of the transistors Q25 and Q26 which serve as a constant current source in the multiplier 321.

The local oscillator 33 consists of a differential amplifier having transistors Q31–Q33, and the collector of the transistor Q31 is connected to the terminal T34. Hot-side and ground-side power lines of the local oscillator 33 are connected to the output line LN35 and the terminal T37 respectively. In this constitution, a local oscillation signal of a predetermined frequency is generated from the local oscillator 33, and the signal thus obtained is supplied to the bases of the transistors Q21 and Q24 in the mixer 32.

Therefore the mixer 32 delivers an unbalanced intermediate frequency signal included in the broadcast signal selected by the tuner 23.

The intermediate frequency signal is then supplied to an intermediate frequency amplifier 34 by way of a signal line formed of the terminal T33, the filter 26 and the terminal T32.

The intermediate frequency amplifier 34 consists of three-stage differential amplifiers 341–343 which are cascade-connected with respect to the intermediate frequency signal and have transistors Q41–Q43 and P41–P43. In this embodiment, hot-side and ground-side power lines of the differential amplifier 341 are connected to the terminals T31 and T37 respectively, while hot-side and ground-side power lines of the differential amplifiers 342 and 343 are connected to the output line LN35 and the terminal T31 respectively.

And the intermediate signal outputted from the intermediate frequency amplifier 34 is supplied to a next-stage AM detector (not shown), from which an audio signal is delivered.

Figure 5:
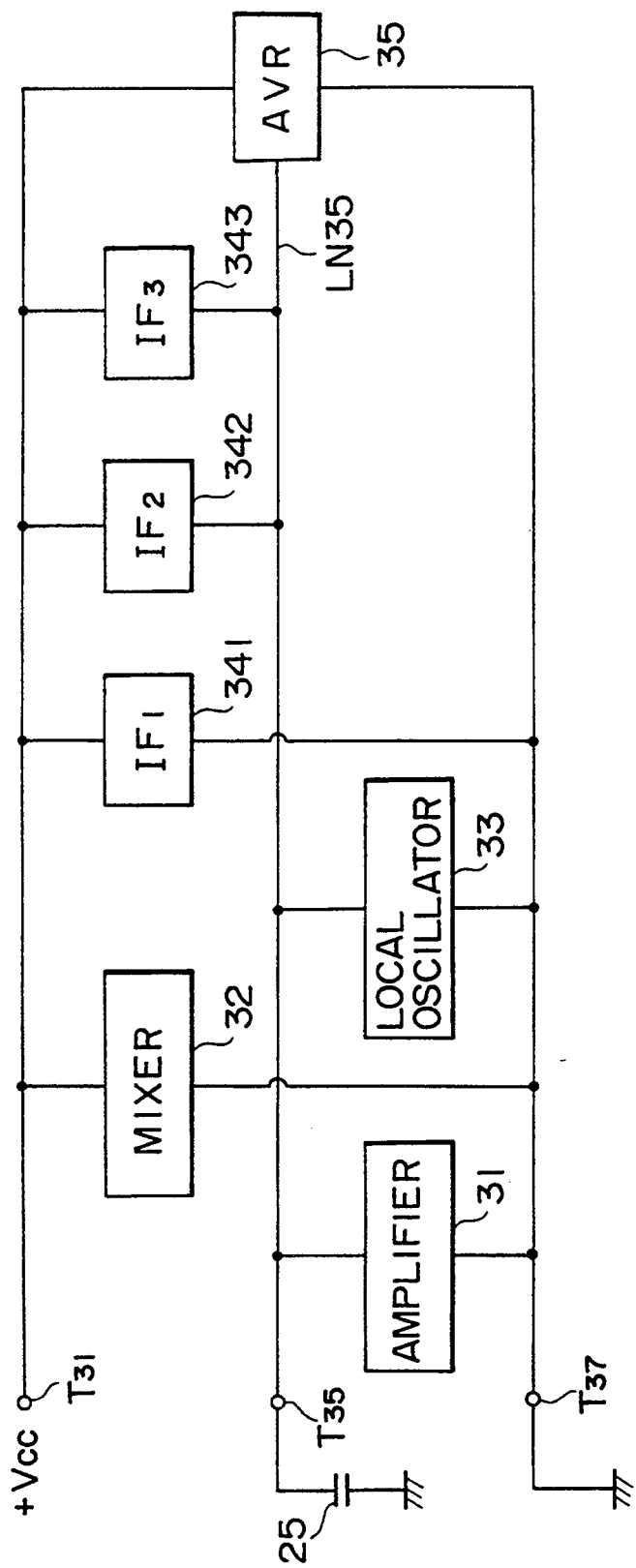
FIG. 5 shows a DC equivalent circuit relative to FIGS. 3 and 4.
Figure 6:
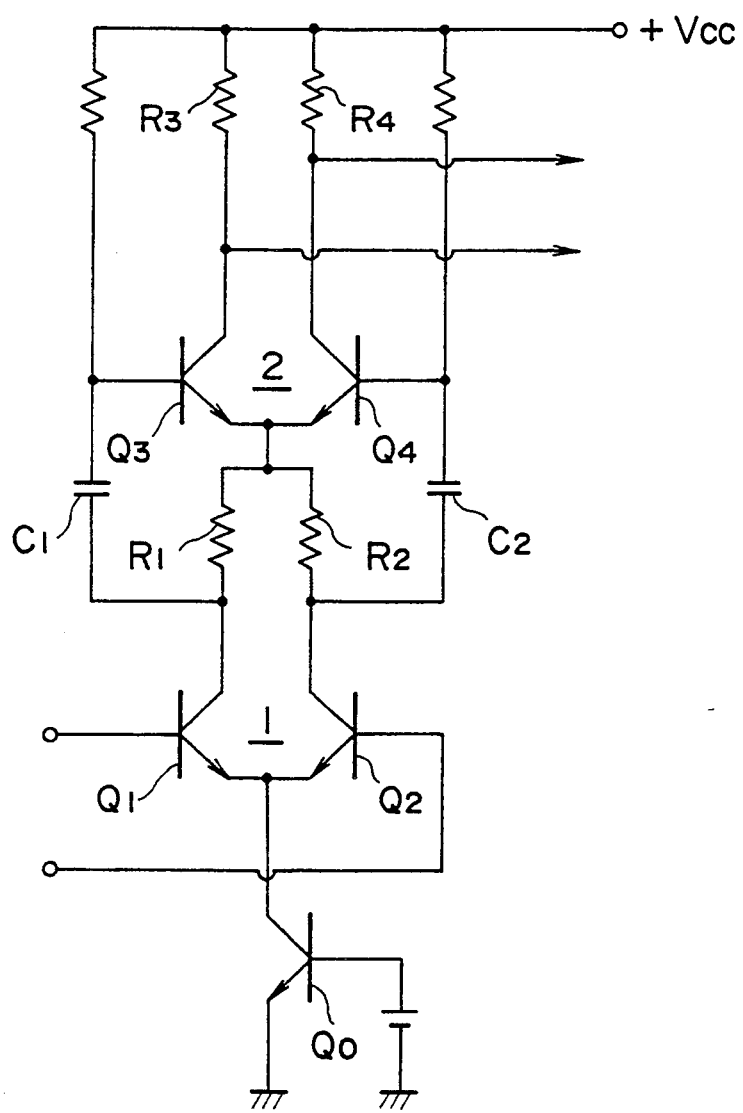
FIG. 6 is a connection diagram of a conventional power supply circuit.

In such constitution, the circuits 31–34 can be represented, with respect to the operating currents, as shown in a DC equivalent circuit diagram of FIG. 5.

Accordingly the difference between the operating current of the high frequency amplifier 31, the local oscillator 33 and the operating current of the intermediate frequency amplifiers 342, 343 flows into or out from the constant voltage regulator 35, so that the required operating currents of optimal values are supplied respectively to the circuits 31, 33, 342 and 343. At this time, the operating voltage for the circuits 31 and 33 is supplied from the output line LN35 and is therefore a regulated constant voltage.

In the embodiment of FIGS. 1 and 2, if the condition of Ill>I13 is maintained regardless of the circuit configuration and the operation of the amplifier 11 and the local oscillator 13, then the requirement for the constant voltage regulator 15 is merely a capability of outputting the difference current $\Delta I$. Meanwhile in the case of Ill<I13, the requirement for the constant voltage regulator 15 is merely an inflow of the difference current $\Delta I$.

According to the present invention where the operating current lines of the amplifier 11 and the local oscillator 13 are connected in series to the power source, the two circuits 11 and 13 can be driven by the operating current needed for one circuit alone, so that the entire current consumption is reducible.

Particularly in the present invention, the difference $\Delta I$, if any, between the operating currents Ill and I13 of the amplifier 11 and the local oscillator 13 is absorbed by the constant voltage regulator 15, so that it becomes possible to control the operating currents Ill and I13 of the amplifier 11 and the local oscillator 13 to the respective optimal values to consequently realize satisfactory operations of both the amplifier 11 and the local oscillator 13 in the best conditions.

Furthermore, the middle junction of the operating current lines of the two circuits 11 and 13 is bypassed by the capacitor 5 connected to the terminal T14, so that even if some signal current components are included in the operating currents Ill and I13 flowing respectively in the circuits 11 and 13, there never occurs an undesired phenomenon that such signal current components harmfully affect the opposite circuits 13 and 11, which are thereby stabilized in operation. And the degree of freedom in designing each of the circuits 11 and 13 can be enhanced.

In the circuits 11 and 13 formed into a balanced type, if the balanced state thereof is upset due to some variations caused in the manufacture of the IC and any signal current components are included in the respective operating currents Ill and I13 of the circuits 11 and 13, no problem arises for the reason described above.

In addition, the stable operation of the local oscillator 13 can be continuously ensured since the regulated operating voltage V15 is supplied from the output line LN15 of the constant voltage regulator 15 to the local oscillator 13.

What is claimed is:

1. A power supply circuit comprising a first circuit having an operating current line, a second circuit having an operating current line, said operating current lines being connected in series between a power source and ground and forming a middle junction, and a constant voltage regulator connected to said power source, ground and said middle junction and including a plurality of current mirror circuits for detecting operating currents flowing in said first and second circuits, so that any difference between the operating currents of said first and second circuits is delivered or absorbed by said constant voltage regulator.

2. A power supply circuit comprising a first circuit having an operating current line and including transistors of a first polarity and a second circuit having an operating current line and including transistors reverse in polarity of the transistors of said first circuit, wherein said operating current line of said first circuit and said operating current line of said second circuit are connected in series between a power source and ground and form a middle junction, and a constant voltage regulator connected to said power source and ground and having an output line connected to said middle junction and including a plurality of current mirror circuits for detecting operating currents flowing in said first and second circuits, so that any difference between the operating currents of said first and second circuits is delivered or absorbed by said constant voltage regulator.

3. A power supply circuit comprising a first circuit having an operating current line, a second circuit having an operating current line, and a constant voltage regulator having an output line, said first and second circuits and constant voltage regulator being assembled in an IC, wherein the operating current lines of said first and second circuits are connected in series to each other to form a middle junction between a power terminal and ground terminal and the output line of said constant voltage regulator is connected to the middle junction, said constant voltage regulator including a plurality of current mirror circuits for detecting operation currents flowing in said first and second circuits so that any difference between the operating currents of said first and second circuits is delivered or absorbed by said constant voltage regulator.

4. The power supply circuit according to claim 2 formed into an IC for use in a radio receiver,
wherein said first circuit serves as a high frequency amplifier and said second circuit serves as a local oscillator.

5. The power supply circuit according to claim 2 formed into an IC for use in a radio receiver,
wherein said first circuit serves as an intermediate frequency amplifier and said second circuit serves as a high frequency amplifier and a local oscillator.

* * * * *

UNITED STATES PATENT AND TRADEMARK OFFICE
CERTIFICATE OF CORRECTION

PATENT NO. : 5,349,285
DATED : September 20, 1994
INVENTOR(S) : Taiwa Okanobu

It is certified that error appears in the above-indentified patent and that said Letters Patent is hereby corrected as shown below:

Col. 5, line 19, change "unrequited" to --unrequired--

<u>In the Claims</u>:

Col. 10, line 56, after "ground" insert --,--

Signed and Sealed this

Sixth Day of June, 1995

BRUCE LEHMAN

*Attest:*

*Attesting Officer*    Commissioner of Patents and Trademarks